(12) United States Patent
Dordi et al.

(10) Patent No.: US 7,358,186 B2
(45) Date of Patent: Apr. 15, 2008

(54) METHOD AND APPARATUS FOR MATERIAL DEPOSITION IN SEMICONDUCTOR FABRICATION

(75) Inventors: Yezdi Dordi, Palo Alto, CA (US); John Boyd, Atascadero, CA (US); William Thie, Mountain View, CA (US); Bob Maraschin, Cupertino, CA (US); Fred C. Redeker, Fremont, CA (US); Joel M. Cook, Warrenton, VA (US)

(73) Assignee: Lam Research Corporation, Fremont, CA (US)

( * ) Notice: Subject to any disclaimer, the term of this patent is extended or adjusted under 35 U.S.C. 154(b) by 256 days.

(21) Appl. No.: 10/735,216

(22) Filed: Dec. 12, 2003

(65) Prior Publication Data

US 2005/0130415 A1 Jun. 16, 2005

(51) Int. Cl.
*H01L 21/44* (2006.01)
*B05C 5/12* (2006.01)

(52) U.S. Cl. .......................... 438/678; 427/98; 118/58; 118/603

(58) Field of Classification Search ................ 438/678; 118/50.1, 429, 620, 58, 603; 427/98
See application file for complete search history.

(56) References Cited

U.S. PATENT DOCUMENTS

| 4,239,789 | A | | 12/1980 | Blum et al. |
| 4,359,485 | A | | 11/1982 | Donnelley et al. |
| 4,982,065 | A | * | 1/1991 | Sandaiji et al. ............... 216/22 |
| 6,524,663 | B1 | * | 2/2003 | Kelly et al. .................. 427/553 |
| 6,713,122 | B1 | * | 3/2004 | Mayer et al. .................. 216/13 |
| 2003/0098241 | A1 | * | 5/2003 | Homma et al. ............. 205/206 |
| 2005/0126932 | A1 | * | 6/2005 | Redeker et al. ............. 205/794 |

FOREIGN PATENT DOCUMENTS

EP 0 260 516 3/1988

* cited by examiner

Primary Examiner—Thanh Nguyen
(74) Attorney, Agent, or Firm—Martine Penilla & Gencarella, LLP

(57) ABSTRACT

Broadly speaking, a method and an apparatus are provided for depositing a material on a semiconductor wafer ("wafer"). More specifically, the method and apparatus provide for selective heating of a surface of the wafer exposed to an electroless plating solution. The selective heating is provided by applying radiant energy to the wafer surface. The selective heating of the wafer surface causes a temperature increase at an interface between the wafer surface and the electroless plating solution. The temperature increase at the interface in turn causes a plating reaction to occur at the wafer surface. Thus, material is deposited on the wafer surface through an electroless plating reaction that is initiated and controlled by varying the temperature of the wafer surface using an appropriately defined radiant energy source.

19 Claims, 15 Drawing Sheets

METHOD AND APPARATUS FOR MATERIAL DEPOSITION IN SEMICONDUCTOR FABRICATION

CROSS REFERENCE TO RELATED APPLICATIONS

This application is related to U.S. patent application Ser. No. 10/734,704, filed on even date herewith, and entitled "Method and Apparatus for Semiconductor Wafer Planarization." The disclosure of this related application is incorporated herein by reference.

BACKGROUND OF THE INVENTION

1. Field of the Invention

The present invention relates generally to semiconductor fabrication. More specifically, the present invention relates to material deposition on a semiconductor wafer.

2. Description of the Related Art

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The series of manufacturing operations for defining features on the semiconductor wafers can include many processes such as adding, patterning, etching, removing, and polishing, among others, various material layers. Due to the intricate nature of the features defined on the semiconductor wafers, it is necessary to perform each process in a precise manner. For example, it is often desirable to deposit a material on a surface of the wafer such that the material conforms uniformly to a topography of the surface of the wafer.

FIG. 1A is an illustration showing a cross-section view of the wafer surface following a non-uniform material deposition, in accordance with the prior art. The wafer surface is defined to have features 101 and 102 which form a topography across the wafer surface. The topography is characterized by surfaces that are substantially parallel to the wafer and surfaces that are substantially perpendicular to the wafer. Additionally, some features (e.g., feature 102) may be skewed such that their surfaces are neither parallel nor perpendicular to the wafer.

Prior art methods of material deposition using physical vapor deposition techniques tend to deposit greater amounts of material on feature surfaces having greater exposure to a material source region 111 from which the material is deposited. In general, the material source region 111 is represented by the region above the wafer. Therefore, since feature surfaces that are substantially parallel to the wafer have greater exposure to the material source region 111, these feature surfaces tend to accumulate greater amounts of deposited material. For example, with respect to FIG. 1A, a thickness 107 of a deposited material 103 is larger than a thickness 105, wherein the thicknesses 107 and 105 are deposited on feature surfaces that are substantially parallel and perpendicular, respectively, to the wafer. Additionally, in some instances the non-uniformities in material deposition can be significant enough to cause discontinuities in the material being deposited. For example, a discontinuity 109 is shown at a location underlying an overhang of the skewed feature 102. In certain applications, it is more desirable to have a uniform thickness of the material deposited over each feature surface regardless of the feature surface orientation. Also, it is generally not acceptable to have discontinuities present in a deposited material layer. Thus, non-uniform material deposition caused by variations in surface exposure to the material source region 111 can be problematic.

FIGS. 1B-1 through 1B-4 are illustrations showing a material deposition sequence leading to void formation, in accordance with the prior art. FIG. 1B-1 shows a wafer surface having features 101 prior to deposition of the material 103. The features 101 define a topography of the wafer surface. In some instances, the features may represent high-aspect ratio features wherein the ratio of the feature's vertical dimension to its lateral dimension is greater than 2 or 3 to 1.

FIG. 1B-2 shows a beginning stage of a material deposition process intended to fill a space between the adjacent features 101 with the material 103. As previously discussed with respect to FIG. 1A, prior art material deposition methods tend to result in deposited material layers having non-uniform thicknesses. The thickness 107 of the deposited material 103 is larger than the thickness 105, wherein the thicknesses 107 and 105 are deposited on feature 101 surfaces that are substantially parallel and perpendicular, respectively, to the wafer.

FIG. 1B-3 shows a later stage of the material deposition process intended to fill the space between the adjacent features 101 with the material 103. Due to the non-uniform material deposition, the feature 101 surfaces that are substantially parallel to the wafer have accumulated a greater thickness of the material 103 than the surfaces that are substantially perpendicular to the wafer. Furthermore, as the lateral deposition continues and the lateral distance diminishes, it becomes more difficult for reactants to reach the lower region and further reduces the deposition rate in these regions.

FIG. 1B-4 shows the final result of the material deposition process intended to fill the space between the adjacent features 101 with the material 103. Due to the non-uniform material deposition, the deposited material on each of the substantially parallel feature 101 surfaces ultimately reaches a thickness at which a bridge is formed between adjacent features. The bridge results in formation of a void, or keyhole, 113 within the space between the adjacent features 101. Thus, non-uniformities in material deposition can lead to unsatisfactory material deposition results.

In view of the foregoing, there is a need for an apparatus and a method to uniformly deposit a material over a wafer surface.

SUMMARY OF THE INVENTION

Broadly speaking, a method and an apparatus are provided for depositing a material on a semiconductor wafer ("wafer"). More specifically, the present invention provides a method and apparatus for selectively heating a material present on a surface of the wafer exposed to an electroless plating solution. The selective heating is provided by applying radiant energy to the wafer surface. The radiant energy is defined to have a wavelength range that will preferentially heat the material present on the wafer surface relative to other surrounding materials. The radiant energy can be adjusted during the plating process to optimally follow changing conditions of the material present on the wafer surface. The selective heating of the wafer surface causes a temperature increase at an interface between the wafer surface and the electroless plating solution. As a result of the heating operation, the temperature increase at the interface causes a plating reaction to occur at the wafer surface. Thus, material is deposited on the wafer surface through an electroless plating reaction that is initiated and controlled by varying the temperature of the wafer surface using an appropriately defined radiant energy source.

In one embodiment, a method for depositing a material on a surface of a wafer is disclosed. The method includes applying an electroless plating solution to the surface of the wafer. The electroless plating solution is maintained at a temperature at which a plating reaction will not occur. The method also includes exposing the surface of the wafer to radiant energy that is capable of increasing a temperature of the surface of the wafer to a state at which the plating reaction will occur, wherein the plating reaction occurs at an interface between the surface of the wafer and the electroless plating solution.

In another embodiment, an apparatus for depositing a material on a surface of a wafer is disclosed. The apparatus includes a tank defined by an enclosing wall and a bottom. The tank is configured to contain an electroless plating solution. Also, a wafer support structure is disposed within the tank. The wafer support structure is configured to support a wafer at a submerged position within the electroless plating solution to be contained within the tank. The apparatus further includes a radiant energy source disposed above the wafer support structure. The radiant energy source is oriented to direct radiant energy toward the wafer to be supported at the submerged position within the electroless plating solution.

In another embodiment, another apparatus for depositing a material on a surface of a wafer is disclosed. The apparatus includes a vessel defined by a top, a bottom, and an enclosing wall. The vessel is configured to contain an electroless plating solution. Also, a wafer support structure is disposed within the vessel. The wafer support structure is configured to support a wafer at a position within the vessel. The apparatus further includes a radiant energy source disposed above the wafer support structure. The radiant energy source is oriented to direct radiant energy toward the wafer to be supported within the vessel.

In another embodiment, another apparatus for depositing a material on a surface of a wafer is disclosed. The apparatus includes a tank defined by an enclosing wall and a bottom. The tank is configured to contain an electroless plating solution. The apparatus also includes a wafer holder configured to dip a wafer into and remove the wafer from the electroless plating solution to be contained within the tank. Additionally, a radiant energy source is disposed above the electroless plating solution to be contained within the tank. The radiant energy source is oriented to direct radiant energy toward the wafer upon removal of the wafer from the electroless plating solution.

In another embodiment, another apparatus for depositing a material on a surface of a wafer is disclosed. The apparatus includes a tank defined by an enclosing wall and a bottom. The tank is configured to contain an electroless plating solution. The apparatus also includes a wafer holder configured to rotate a portion of the wafer through the electroless plating solution to be contained within the tank. Additionally, a radiant energy source is disposed above the electroless plating solution to be contained within the tank. The radiant energy source is oriented to direct radiant energy toward the portion of the wafer upon rotation out of the electroless plating solution.

In another embodiment, another apparatus for depositing a material on a surface of a wafer is disclosed. The apparatus includes a tank defined by an enclosing wall and a bottom. The tank is configured to contain an electroless plating solution. Also, a wafer support structure is disposed within the tank. The wafer support structure is configured to support a wafer at a submerged position within the electroless plating solution to be contained within the tank. The apparatus further includes a radiant energy source disposed within the wafer support structure. The radiant energy source is oriented to direct radiant energy toward a bottom surface of the wafer to be supported at the submerged position within the electroless plating solution. The radiant energy is capable of traversing through the wafer to heat a material present on a top surface of the wafer.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which:

FIG. 3 is an illustration showing a variation of the apparatus of FIG. 2A, in accordance with one embodiment of the present invention;

FIG. 4 is an illustration showing another variation of the apparatus of FIG. 2A, in accordance with one embodiment of the present invention;

DETAILED DESCRIPTION

Broadly speaking, a method and an apparatus are provided for depositing a material on a semiconductor wafer ("wafer"). More specifically, the present invention provides a method and apparatus for selectively heating a material present on a surface of the wafer exposed to an electroless plating solution. The selective heating is provided by applying radiant energy to the wafer surface. The radiant energy is defined to have a wavelength range that will preferentially heat the material present on the wafer surface relative to other surrounding materials. The radiant energy can be adjusted during the material deposition process to optimally follow changing conditions of materials present on the wafer surface. The selective heating of the wafer surface causes a temperature increase at an interface between the wafer surface and the electroless plating solution. The temperature increase at the interface in turn causes a plating reaction to occur at the wafer surface. Thus, material is deposited on the wafer surface through an electroless plating reaction that is initiated and controlled by varying the temperature of the wafer surface using an appropriately defined radiant energy source.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 2A:
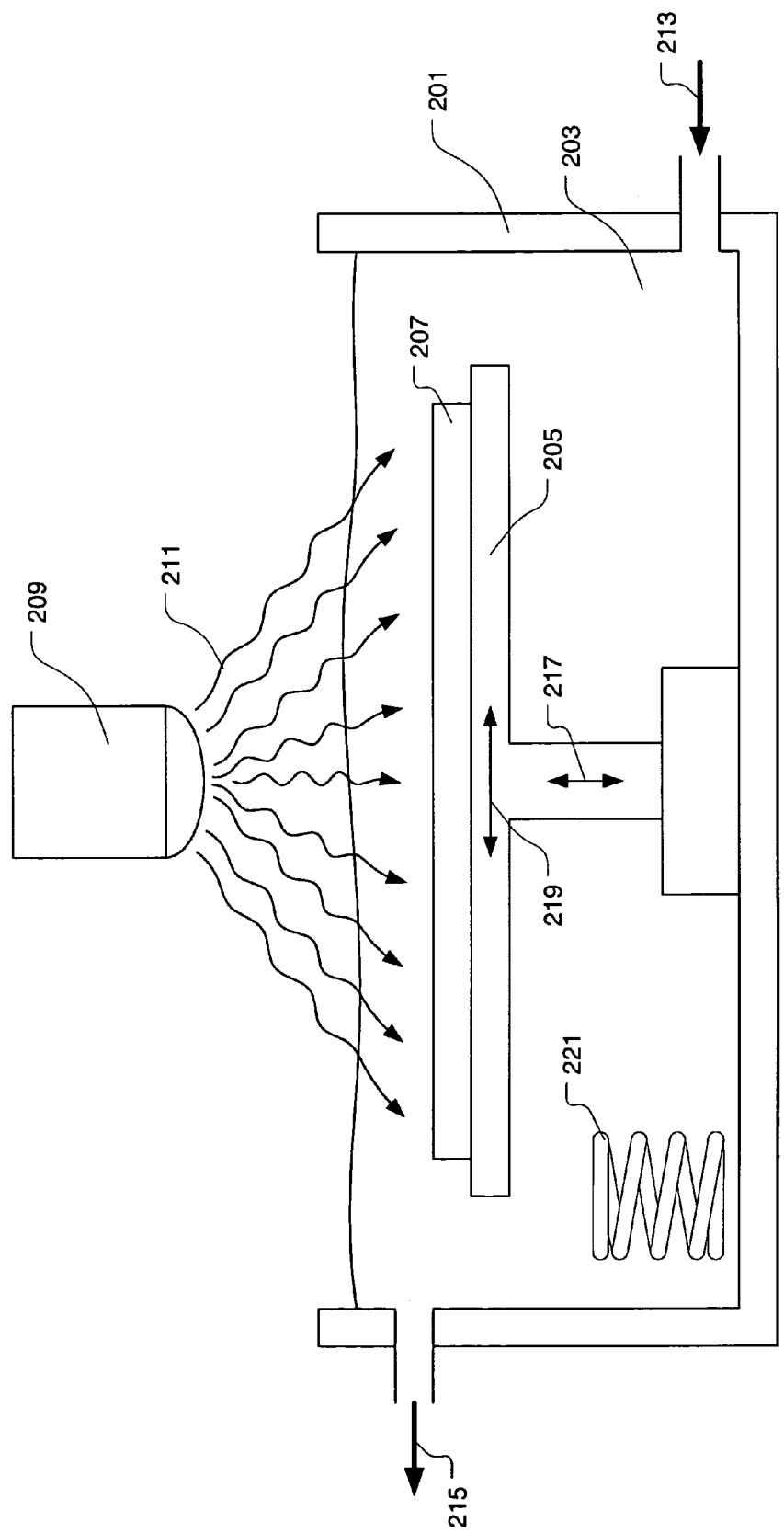
FIG. 2A is an illustration showing an apparatus for depositing a material on a surface of a wafer, in accordance with one embodiment of the present invention.

FIG. 2A is an illustration showing an apparatus for depositing a material on a surface of a wafer, in accordance with one embodiment of the present invention. The apparatus includes a tank 201 defined by an enclosing wall and a bottom. The tank 201 is configured to contain an electroless plating solution 203. The present invention can be implemented using suitable and commonly available electroless plating solutions, such as Cuposit250, manufactured by Shipley Company. Alternatively, a customized electroless plating solution can be developed for use with the present invention. It is preferable, however, that the electroless plating solution 203 be defined to react at moderate to higher temperatures. For example, in one embodiment, the electroless plating solution 203 will not react at temperatures below about 40° C.

In one embodiment, an inlet 213 is provided for supplying the electroless plating solution 203 to the tank 201, and an outlet 215 is provided for removing the electroless plating solution 203 from the tank 201. Thus, the inlet 213 and the outlet 215 can be used to control a flow of the electroless plating solution 203 through the tank 201. In one embodiment, the electroless plating solution 203 can be periodically replenished. In another embodiment, a continuous flow of the electroless plating solution 203 through the tank 201 can be provided. It should also be appreciated that baffles and other flow diverting mechanisms can be disposed within the tank 201 to provide a desired directionality and uniformity to the flow of electroless plating solution 203 through the tank 201. Furthermore, in one embodiment, a heat exchanger 221 can be implemented within the tank 201 to maintain a temperature of the electroless plating solution 203 within the tank 201. In another embodiment, the heat exchanger 221 can be implemented outside of the tank 201 to maintain the temperature of the electroless plating solution 203 entering the tank 201. In one embodiment, the heat exchanger 221 is represented as a coil over which the electroless plating solution 203 is flowed. However, it should be appreciated that any other type of heat exchanger 221 suitable for affecting the temperature of the electroless plating solution 203 can be implemented with the present invention. Preferably, the electroless plating solution 203 is maintained at a substantially low temperature. For example, in one embodiment, the electroless plating solution 203 is maintained at a temperature below about 15° C., wherein a lower bound of the electroless plating solution 203 temperature is limited by solubility.

The apparatus of FIG. 2A also includes a wafer support structure 205 disposed within the tank 201 to support a wafer 207 at a submerged position within the electroless plating solution 203. In one embodiment, the wafer support structure 205 is defined to provide substantially complete contact with a bottom surface of the wafer 207. However, in other embodiments, the wafer support structure 205 can be defined to provide partial contact with the bottom surface of the wafer 207. For example, in one embodiment, the wafer support structure 205 can include a number of raised areas configured to contact the bottom of the wafer 207. The number of raised areas can be dispersed over the wafer support structure 205 to allow for traversal of a wafer transport device between the bottom of the wafer 207 and the top of the wafer support structure 205. In another exemplary embodiment, the wafer support structure 205 can include a number of lifting pins configured to contact the bottom of the wafer 207. The number of lifting pins can be actuated to raise and lower the wafer 207 with respect to the wafer support structure 205, thus facilitating transport of the wafer 207 to and from the wafer support structure 205. In other embodiments, the wafer support structure 205 can include rollers or finger-like structures. Regardless of the specific wafer support structure 205 embodiment, the wafer support structure 205 is configured to securely hold the wafer 207 during a material deposition process. In one embodiment, the wafer support structure 205 is configured to oscillate during the material deposition process to enhance exposure of a top surface of the wafer 207 to the electroless plating solution 203. In this embodiment, the wafer support structure 205 can be configured to oscillate in a horizontal direction 219, a vertical direction 217, a rotational direction, or any combination of the above directions. Preferably, the wafer support structure 205 is configured to support the wafer 207 in an orientation that minimizes a potential for entrapment of gas bubbles that may evolve from the electroless plating reactions.

The apparatus of FIG. 2A further includes a radiant energy source 209 disposed above the wafer support structure 205. The radiant energy source 209 is oriented to direct radiant energy 211 toward the wafer 207 supported by the wafer support structure 205 at the submerged position within the electroless plating solution 203. The radiant energy source 209 is configured to generate radiant energy 211 having a wavelength range that is capable of selectively heating a material present at the surface of the wafer 207 (i.e., a material upon which the radiant energy 211 will be incident). For purposes of discussion, the radiant energy 211 is characterized in terms of wavelength. However, it should be understood that the radiant energy 211 can be equivalently characterized in terms of frequency. For example, if the surface of the wafer 207 is defined by a material "X", the radiant energy 211 is defined to have a wavelength range that will be absorbed by the atoms/molecules of material "X" to increase excitation of the atoms/molecules of material "X". The increased excitation of the atoms/molecules of material "X" will result in a heating and increased temperature of the material "X". Preferably, the wavelength range of radiant energy 211 necessary to excite the material "X" atoms/molecules will cause zero or limited excitation of atoms/molecules in surrounding materials. Some immediately surrounding materials include different wafer 207 materials that are underlying or adjacent to material "X" and a bulk volume of the electroless plating solution 203. Thus, the radiant energy 211 generated by the radiant energy source 209 is configured to selectively heat a specific material present on the surface of the wafer 207, regardless of an orientation of the specific material present on the surface of the wafer 207. For example, to selectively heat Cu present on the surface of the wafer 207, the radiant energy may be defined to have a wavelength of about 250 nanometers.

In one embodiment, the electroless plating solution 203 is maintained at a sufficiently low temperature at which an electroless plating reaction will not occur. Thus, immersion of the wafer 207 into the electroless plating solution 203 is not sufficient to cause material deposition to occur on the wafer 207 surface through the electroless plating reaction. However, selective heating of a particular material present on the wafer 207 surface through application of the radiant energy 211 will increase the temperature of the particular material to a point at which the electroless plating reaction will occur. Since the particular material is selectively heated by the radiant energy 211, the electroless plating reaction will occur at the interface between the particular material and the electroless plating solution 203. In one embodiment, the radiant energy source 209 is capable of generating the radiant energy 211 in a pulsed manner. Application of the radiant energy 211 in the pulsed manner to the particular material on the wafer 207 surface can be used to heat and quench the particular material in a cyclic manner. In following, through pulsing of the radiant energy 211, electroless plating reactions at the interface between the particular material and the electroless plating solution 203 can be controlled in the cyclic (i.e., pulsed) manner that allows for increased control of material deposition. In one embodiment, a duration of each radiant energy pulse is within a range extending from about 1 millisecond to about 500 milliseconds. It should also be appreciated that an increase in radiant energy intensity will result in an increased temperature of the particular material excited by the radiant energy, with a corresponding increase in electroless plating reaction rate. Thus, with the apparatus of FIG. 2A, materials can be deposited on the wafer 207 surface through electroless plating reactions that are initiated and controlled by varying the temperature of the particular material on the wafer 207 surface using appropriately defined and controlled radiant energy 211.

Preferably, the radiant energy source 209 is configured to apply a substantially uniform amount of radiant energy 211 to the top surface of the wafer 207. In the embodiment of FIG. 2A, the radiant energy source 209 is configured to maintain a stationary position during the material deposition process. However, the stationary radiant energy source 209 is capable of uniformly applying radiant energy 211 over the top surface of the wafer 207. It should be appreciated that a variety of radiant energy 211 reflecting surfaces can be used in conjunction with the stationary radiant energy source 209 to achieve uniform application of the radiant energy 211 to the top surface of the wafer 207. Also, in an alternative embodiment, an array of radiant energy sources can be implemented to uniformly apply the radiant energy 211 over the top surface of the wafer 207. Furthermore, various types of monitoring equipment commonly used in the wafer fabrication process to collect data associated with a surface condition of the wafer can be implemented with the apparatus of FIG. 2A. Data obtained from the monitoring equipment can be used as feedback to control the radiant energy source 209.

Figure 2B:
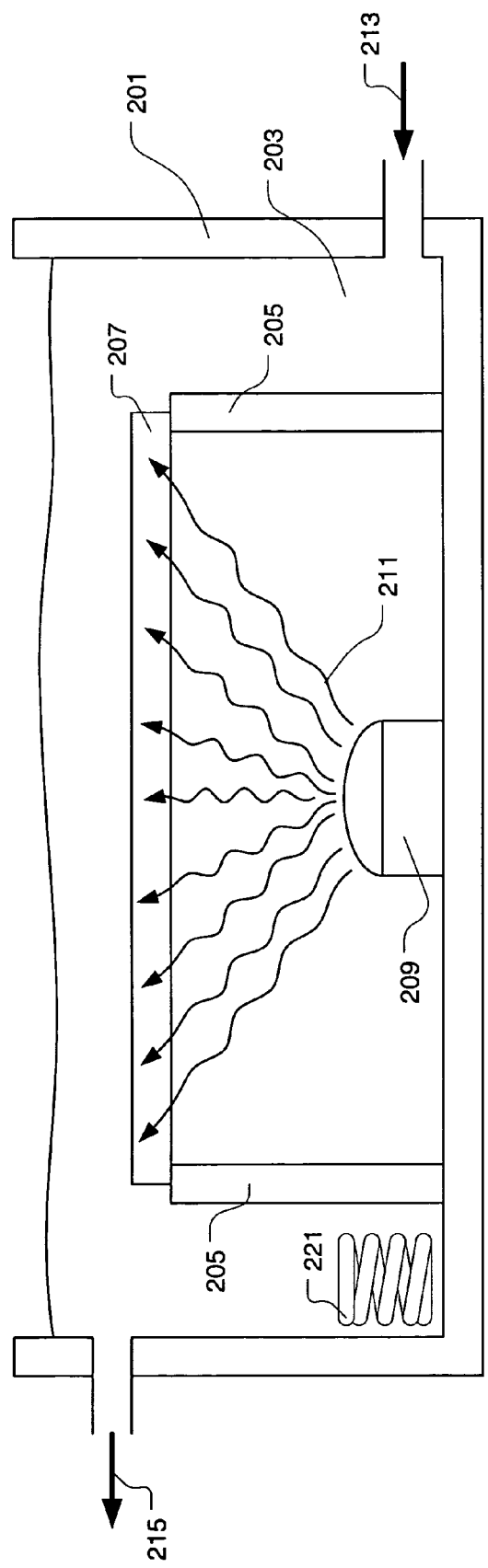
FIG. 2B is an illustration showing a variation of the apparatus of FIG. 2A, in accordance with one embodiment of the present invention.
Figure 3:
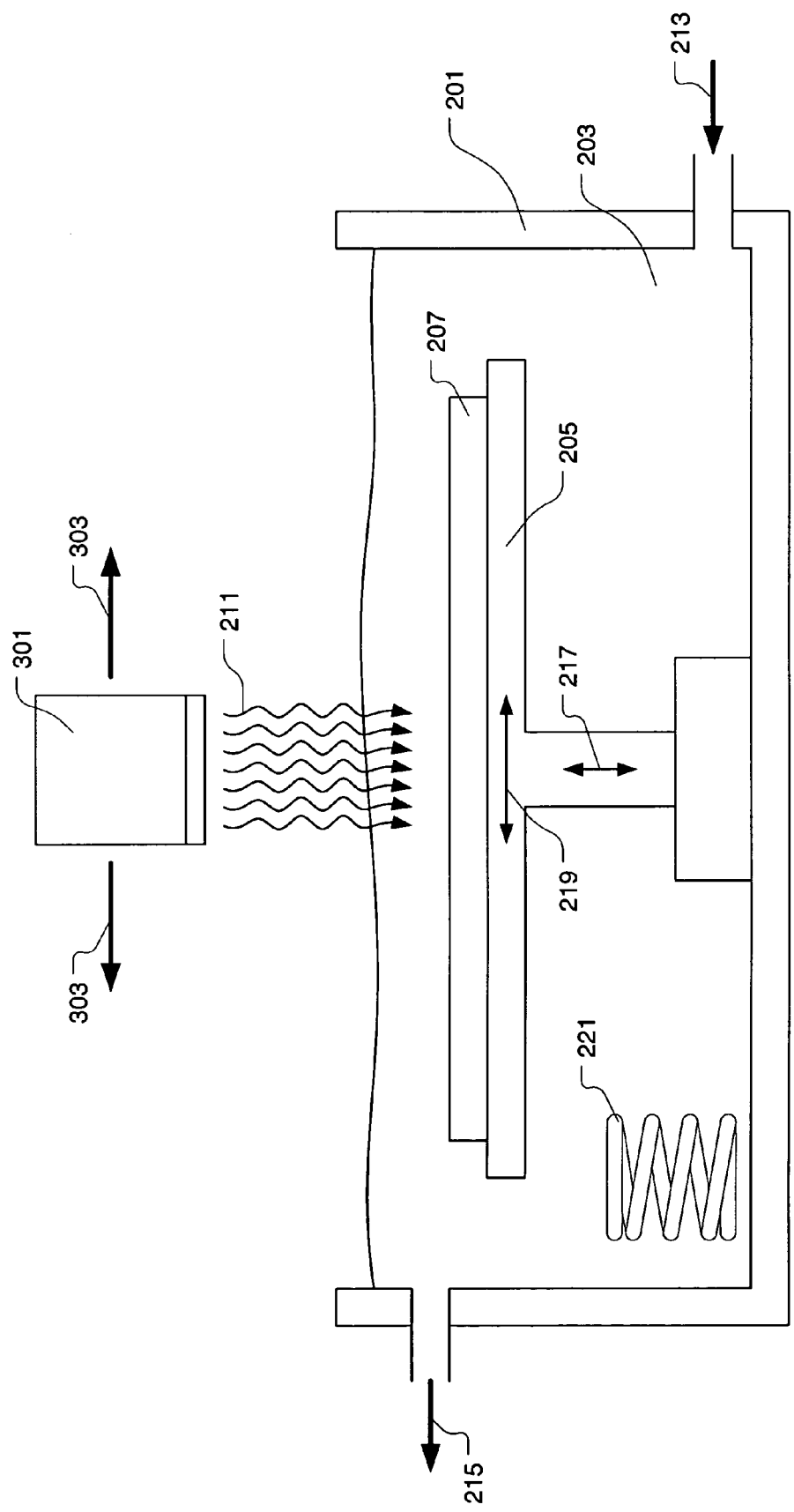
Figure 4:
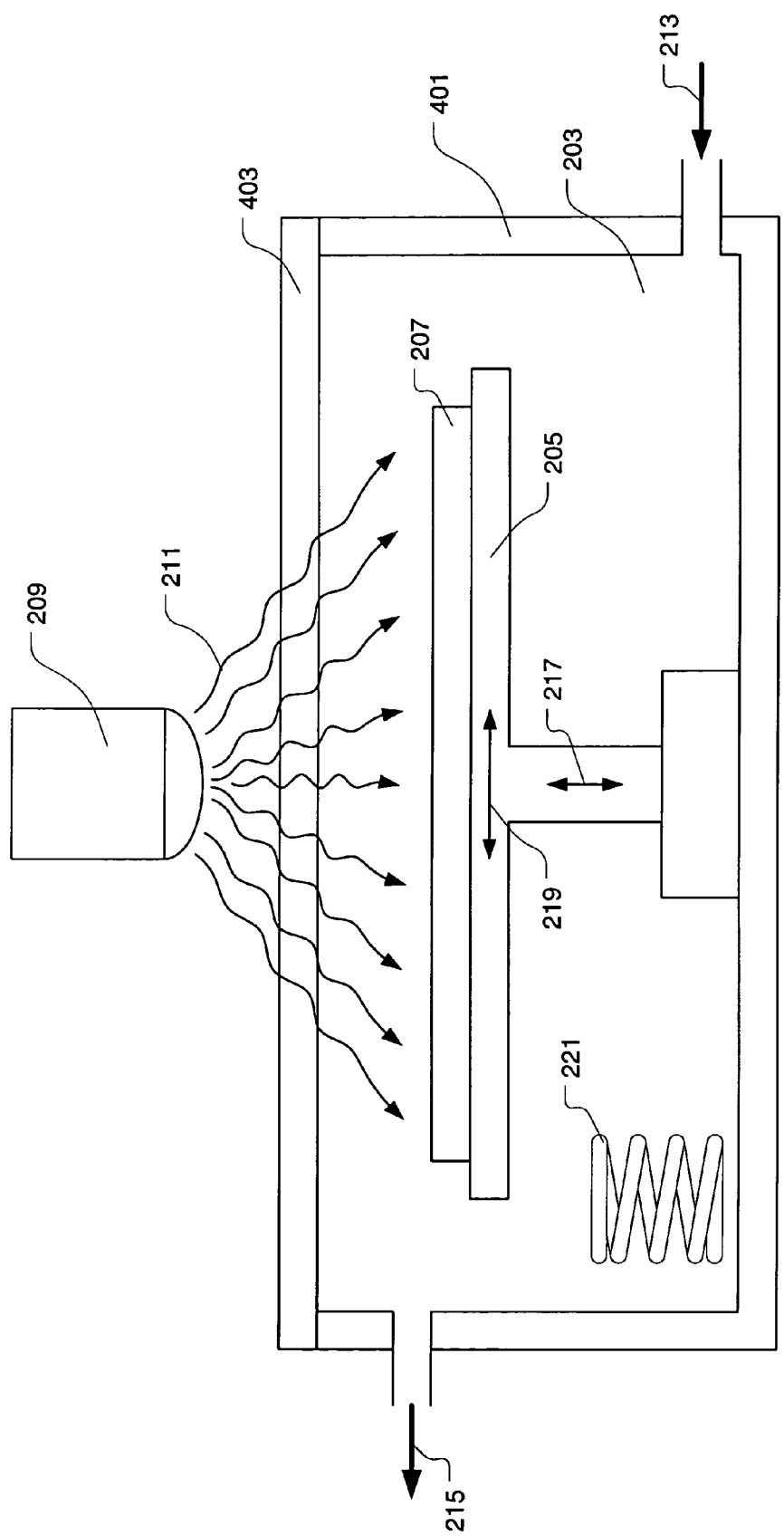

FIG. 2B is an illustration showing a variation of the apparatus of FIG. 2A, in accordance with one embodiment of the present invention. As with FIG. 2A, FIG. 2B includes the tank 201 having the inlet 213 and the outlet 215, the electroless plating solution 203, and the heat exchanger 221. However, with respect to FIG. 2B, the radiant energy source 209 is disposed below a bottom surface of the wafer 207. Also, the wafer support structure 205 is modified to support the wafer 207 around its periphery. In the embodiment of FIG. 2B, the radiant energy 211 is directed from the radiant energy source 209 toward the bottom the wafer 207. The radiant energy 211 traverses through the wafer 207 to a top surface of the wafer 207. It should be appreciated that top surface of the wafer 207 may be defined by a topography having a number of peaks and valleys separated by slopes of varying angle. The radiant energy 207 is defined to have a wavelength range that will allow for minimal interaction with the wafer 207 during traversal through the wafer 207. However, upon reaching the top surface of the wafer 207, the radiant energy 211 wavelength range is defined to selectively heat a material present on the top surface of the wafer 207. Thus, as with FIG. 2A, the apparatus of FIG. 2B provides for material deposition on the wafer 207 surface through electroless plating reactions, wherein the electroless plating reactions are initiated and controlled by varying the temperature of the wafer 207 surface using appropriately defined and controlled radiant energy 211.

Figure 1A:
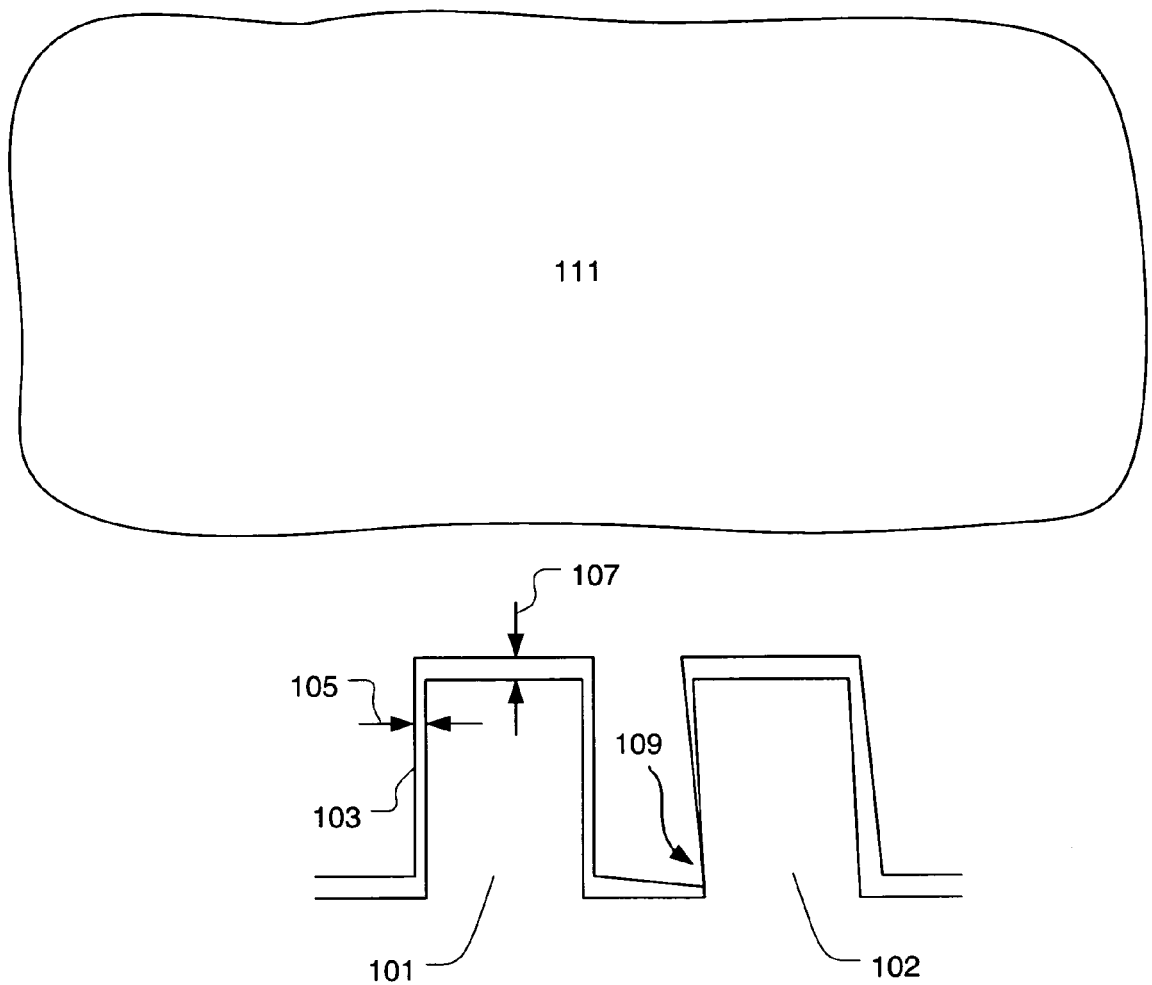
FIG. 1A is an illustration showing a cross-section view of the wafer surface following a non-uniform material deposition, in accordance with the prior art.
Figures 1, 1B:
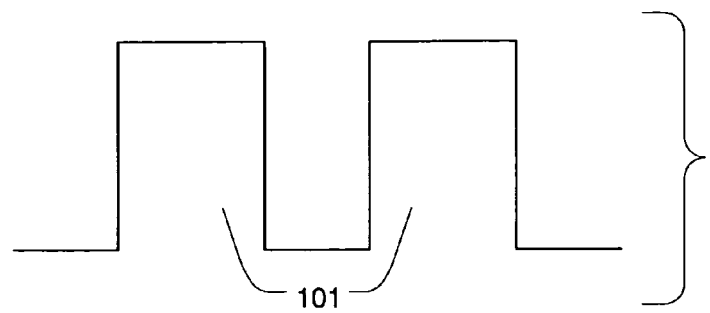
FIGS. 1B-1 through 1B-4 are illustrations showing a material deposition sequence leading to void formation, in accordance with the prior art.
Figures 1, 1B, 2:
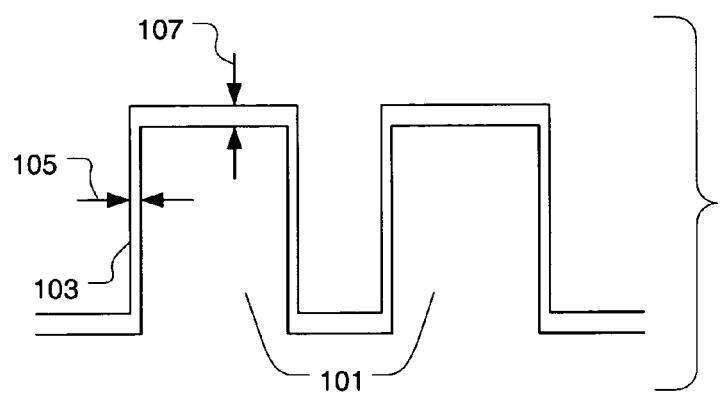
Figures 1, 1B, 2, 3:
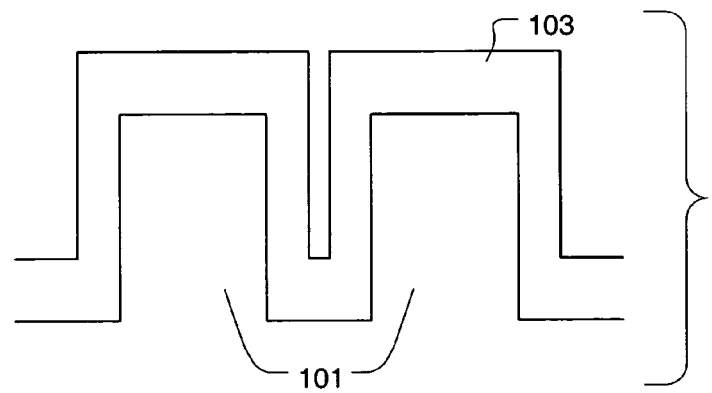

FIG. 3 is an illustration showing a variation of the apparatus of FIG. 2A, in accordance with one embodiment of the present invention. Rather that using the stationary radiant energy source 209, as shown in FIG. 2A, the apparatus of FIG. 3 implements a collimated radiant energy source 301. The collimated radiant energy source 301 is configured to collimate the radiant energy 211 within a limited solid angle. In one embodiment, the collimated radiant energy source 301 is oriented such that the limited solid angle of radiant energy 211 is directed to be substantially perpendicular to a plane within which the wafer 207 lies. The collimated radiant energy source 301 is further configured to be scanned over the surface of the wafer 207 surface as indicated by arrows 303. However, the collimated radiant energy source 301 is not limited to being scanned in the directions indicated by the arrows 303. It should be appreciated that the collimated radiant energy source 301 can be configured to be scanned in any direction over the surface of the wafer 207. Additionally, the collimated radiant energy source 301 can be configured to rotate in a conical manner about an axis that extends from a point of rotation perpendicularly through the plane within which the wafer 207 lies. Regardless of the specific scanning motion utilized, the collimated radiant energy source 301 is configured to apply a substantially uniform amount of radiant energy 211 to the top surface of the wafer 207.

Figures 1, 1B, 2, 3, 4:
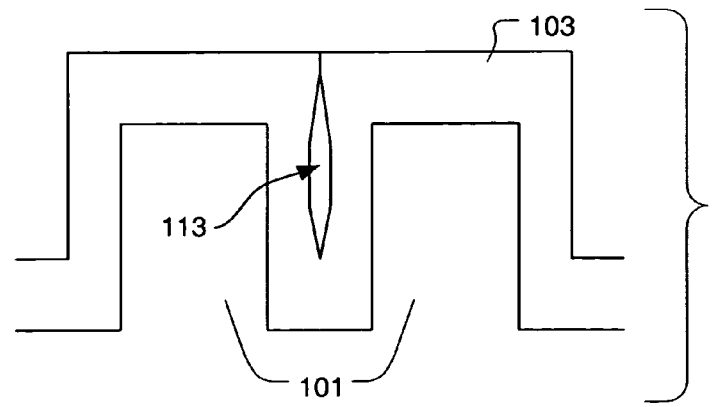

FIG. 4 is an illustration showing another variation of the apparatus of FIG. 2A, in accordance with one embodiment of the present invention. Rather than using the tank 201, as shown in FIG. 2A, the apparatus for depositing material on the surface of the wafer 207 as shown in FIG. 3 uses a vessel 401. The vessel is defined by a top 403, a bottom, and an enclosing wall. As with the tank 201, the vessel 401 is also configured to contain the electroless plating solution 203. Additionally, the vessel 401 can incorporate the inlet 213 for supplying the electroless plating solution 203 to the vessel 401, and the outlet 215 for removing the electroless plating solution 203 from the vessel 401. With respect to FIG. 4, the wafer support structure 205, the heat exchanger 221, the radiant energy source 209, and the radiant energy 211 are equivalent to those described with respect to FIG. 2A. With respect to FIG. 4, however, the radiant energy 211 is transmitted through the top 403 of the vessel 401 to reach the wafer 207. Correspondingly, the top 403 of the vessel 401 is composed of a material ("vessel top material") capable of transmitting the radiant energy 211 emitted from the radiant energy source 209 to an interior of the vessel 401. In various exemplary embodiments, the vessel top material can be either quartz, glass, or polymer, among others. In one embodiment, the top material is configured to transmit the radiant energy 211 without substantially modifying the wavelength range and direction of the radiant energy 211. In another embodiment, the vessel top material is configured to modify the wavelength range of the radiant energy 211 to a wavelength range necessary to selectively heat the desired material present on the top surface of the wafer 207, without modifying a direction of the radiant energy 211. In another embodiment, the vessel top material is configured to modify the direction of the radiant energy 211 to be uniformly distributed over the top surface of the wafer 207, without modifying a wavelength range of the radiant energy 211. In yet another embodiment, the vessel top material is configured to modify both the wavelength range and the direction of the radiant energy 211 to achieve uniform distribution of radiant energy 211 over the top surface of the wafer 207.

For purposes of discussion, a site on the wafer 207 surface at which an electroless plating reaction occurs (i.e., material deposition occurs) is referred to as a nucleation site. A number of nucleation sites per unit area of wafer 207 surface is referred to as a nucleation density. In some material deposition applications, it may be desirable to increase the nucleation density. One way to increase the nucleation density is to increase the pressure of the electroless plating solution. The vessel 401 can be configured to contain the electroless plating solution 203 at an elevated pressure, i.e., a pressure above atmospheric pressure. At the elevated pressure, the nucleation density on the wafer 207 surface during the material deposition process will be increased. Also, at elevated pressures, bubble formation on the wafer surface resulting from the electroless plating reactions can be suppressed. In one embodiment, flow of the electroless plating solution 203 through the inlet 213 and the outlet 215 can be throttled to act as a pressure control capable of controlling a pressure of the electroless plating solution 203 within the vessel 401. In another embodiment, a pressurizer can be implemented as a pressure control within an electroless plating solution circulation system to control the pressure of the electroless plating solution 203 within the vessel 401. The heat exchanger 221, as previously described with respect to FIG. 2A, is used to control the temperature of the electroless plating solution 203 at elevated pressure within the vessel 401. It should be appreciated that the electroless plating solution 203 can be maintained at any suitable pressure and temperature that is compatible with chemistry requirements of the electroless plating solution 203 and mechanical requirements of the vessel 401. Preferably, however, the temperature of the bulk electroless plating solution 203 within the vessel is maintained below the temperature at which the electroless plating reaction occurs. Thus, the electroless plating reaction will only occur at the interface between the selectively heated wafer 207 surface material and the electroless plating solution 203. Also, the cooler bulk electroless plating solution 203 will serve to quench the selectively heating wafer 207 surface material when applying the radiant energy 211 in the pulsed manner.

Figure 5:
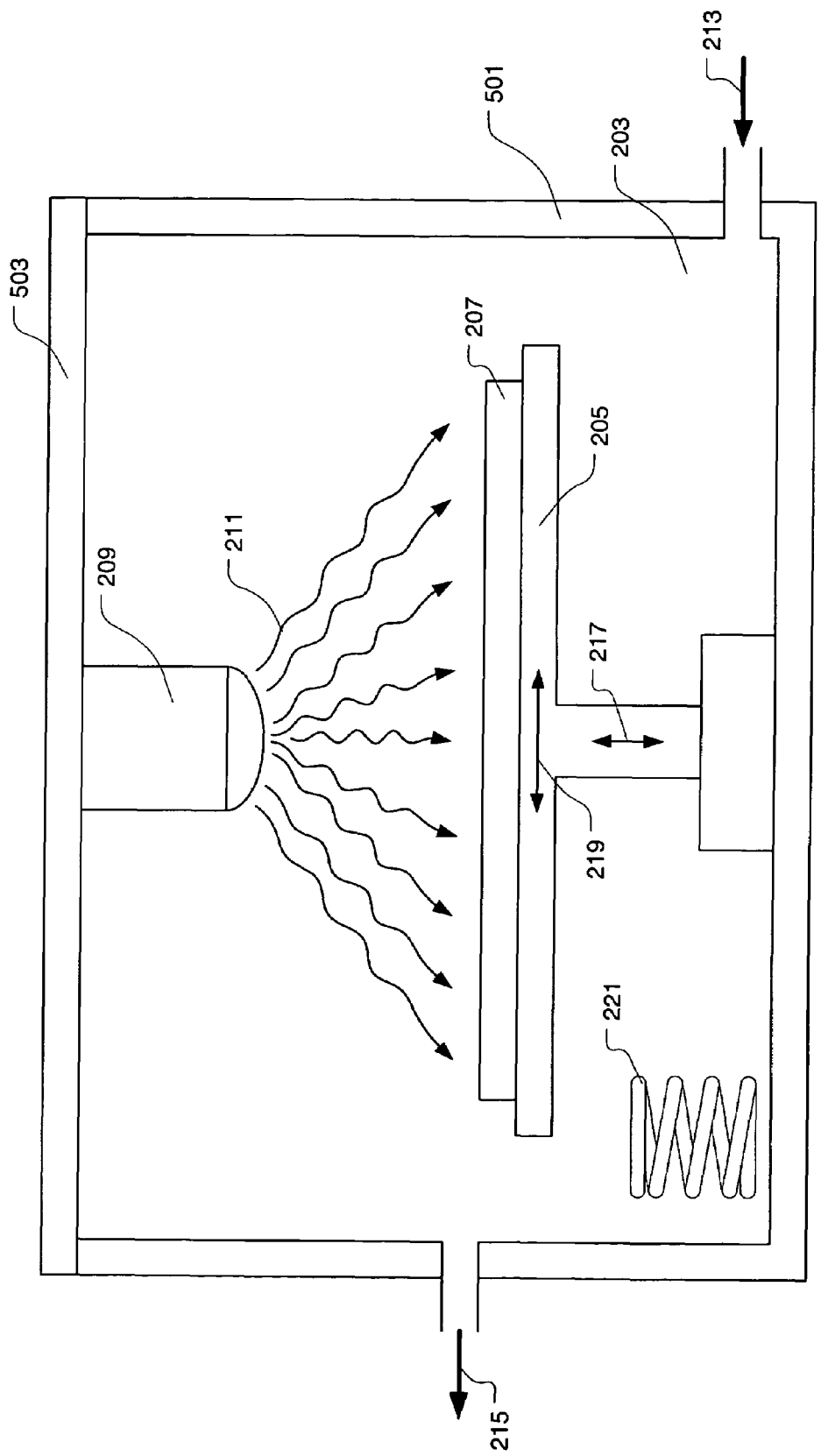
FIG. 5 is an illustration showing a variation of the apparatus of FIG. 4, in accordance with one embodiment of the present invention.

FIG. 5 is an illustration showing a variation of the apparatus of FIG. 4, in accordance with one embodiment of the present invention. As with FIG. 4, the apparatus for depositing material on the surface of the wafer 207 as shown in FIG. 5 also uses a vessel 501. However, in contrast to FIG. 4, the radiant energy source 209 shown in FIG. 5 is disposed within the vessel 501. Thus, the radiant energy source 209 is disposed within the electroless plating solution 203 above the wafer 207. Therefore, a top 503 of the vessel 501 is not required to transmit the radiant energy 211 emitted by the radiant energy source 209. In some situations it may not be appropriate to use of the vessel top material to assist in conditioning the radiant energy 211 in terms of wavelength range and direction. Also, in some situations it may be desirable to maintain the electroless plating solution at an elevated pressure that is not easily withstood by vessel top materials that are sufficient for transmitting the radiant energy 211. By disposing the radiant energy source 209 within the vessel 501, considerations of vessel top material strength and how the vessel top material will affect the wavelength range and direction of the radiant energy 211 can be avoided, while maintaining the ability to control the pressure of the electroless plating solution 203.

In the embodiments of FIGS. 4 and 5, the radiant energy source 209 is configured to maintain a stationary position during the material deposition process. However, the stationary radiant energy source 209 is capable of uniformly applying radiant energy 211 over the top surface of the wafer 207. It should be appreciated that a variety of radiant energy 211 reflecting surfaces can be used in conjunction with the stationary radiant energy source 209, to achieve uniform application of the radiant energy 211 to the top surface of the wafer 207. With respect to FIG. 4, the radiant energy 211 reflecting surfaces can be positioned interior to and/or exterior to the vessel 401. With respect to FIG. 5, the radiant energy 211 reflecting surfaces can be positioned interior to the vessel 501.

Figure 6:
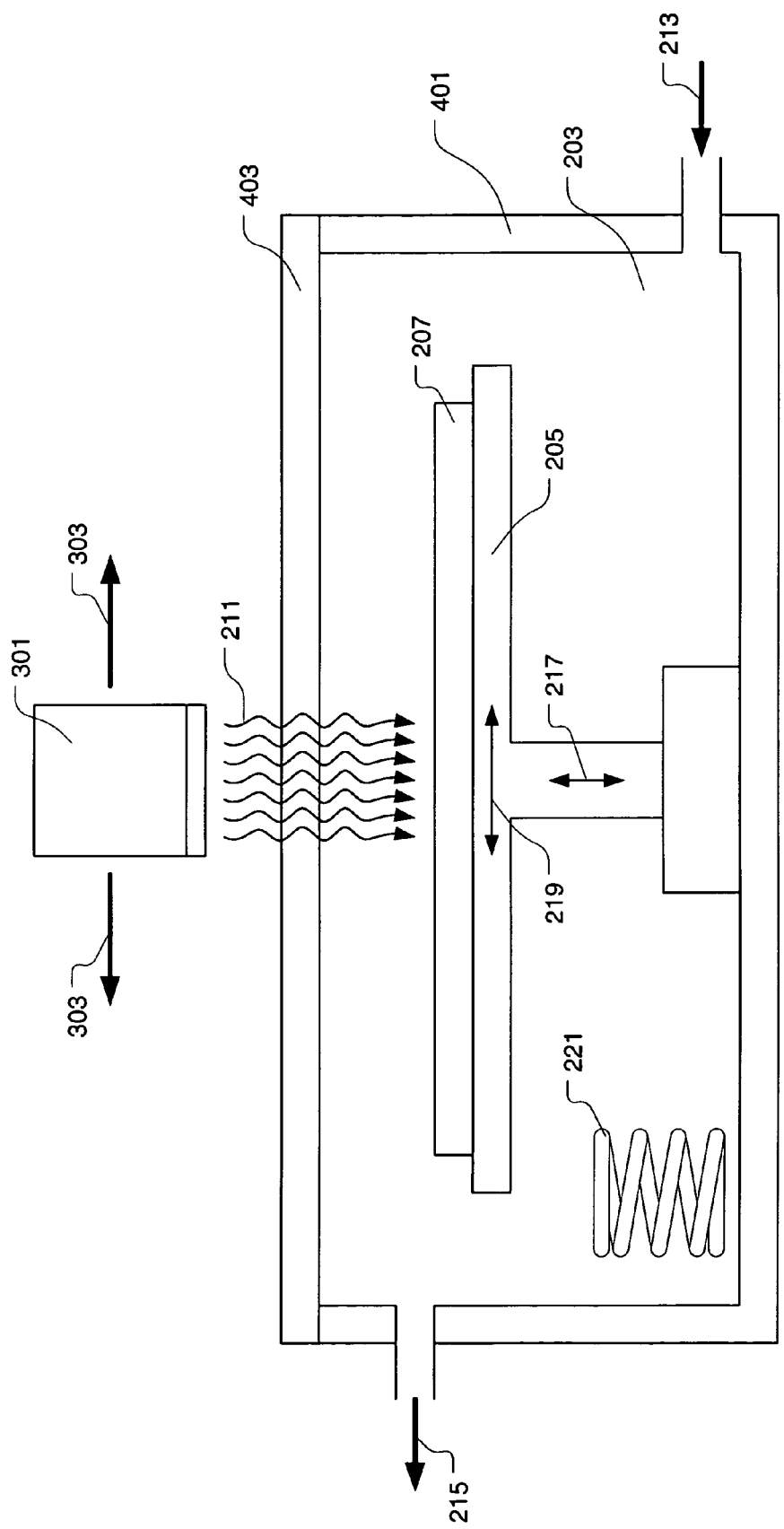
FIG. 6 is an illustration showing an apparatus for depositing material on the surface of the wafer which combines the collimated radiant energy source of FIG. 3 with the vessel of FIG. 4, in accordance with one embodiment of the present invention.

FIG. 6 is an illustration showing an apparatus for depositing material on the surface of the wafer 207 which combines the collimated radiant energy source 301 of FIG. 3 with the vessel 401 of FIG. 4, in accordance with one embodiment of the present invention. In other words, the embodiment of FIG. 6 represents the embodiment of FIG. 4 having the stationary radiant energy source 209 replaced with the collimated radiant energy source 301. The features of the collimated radiant energy source 301 previously discussed with respect to FIG. 3 equally apply to the collimated radiant energy source 301 implemented in the embodiment of FIG. 6.

Figure 7:
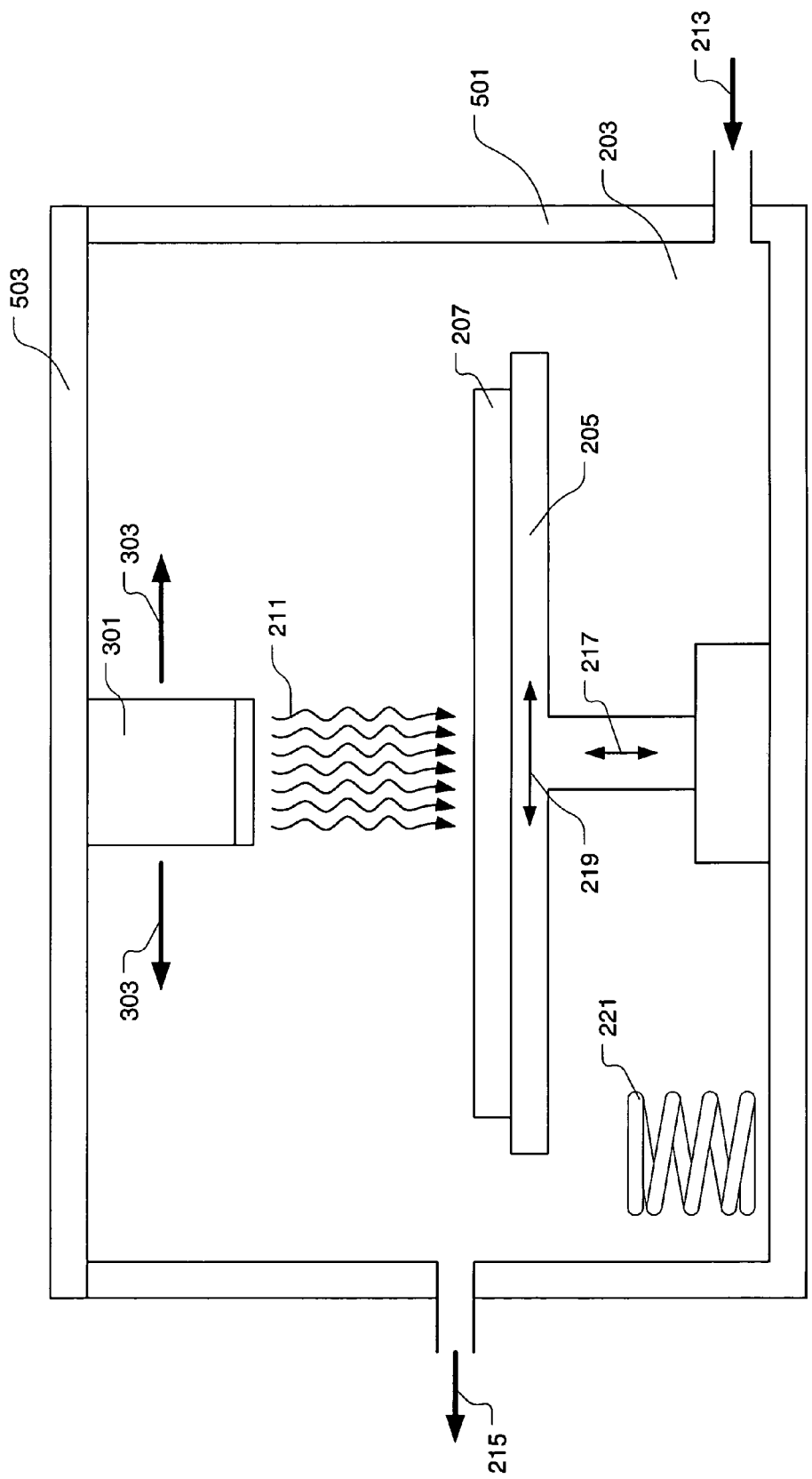
FIG. 7 is an illustration showing an apparatus for depositing material on the surface of the wafer which combines the collimated radiant energy source of FIG. 3 with the vessel of FIG. 5, in accordance with one embodiment of the present invention.

FIG. 7 is an illustration showing an apparatus for depositing material on the surface of the wafer 207 which combines the collimated radiant energy source 301 of FIG. 3 with the vessel 501 of FIG. 5, in accordance with one embodiment of the present invention. In other words, the embodiment of FIG. 7 represents the embodiment of FIG. 5 having the stationary radiant energy source 209 replaced with the collimated radiant energy source 301. The features of the collimated radiant energy source 301 previously discussed with respect to FIG. 3 equally apply to the collimated radiant energy source 301 implemented in the embodiment of FIG. 7.

Figure 8:
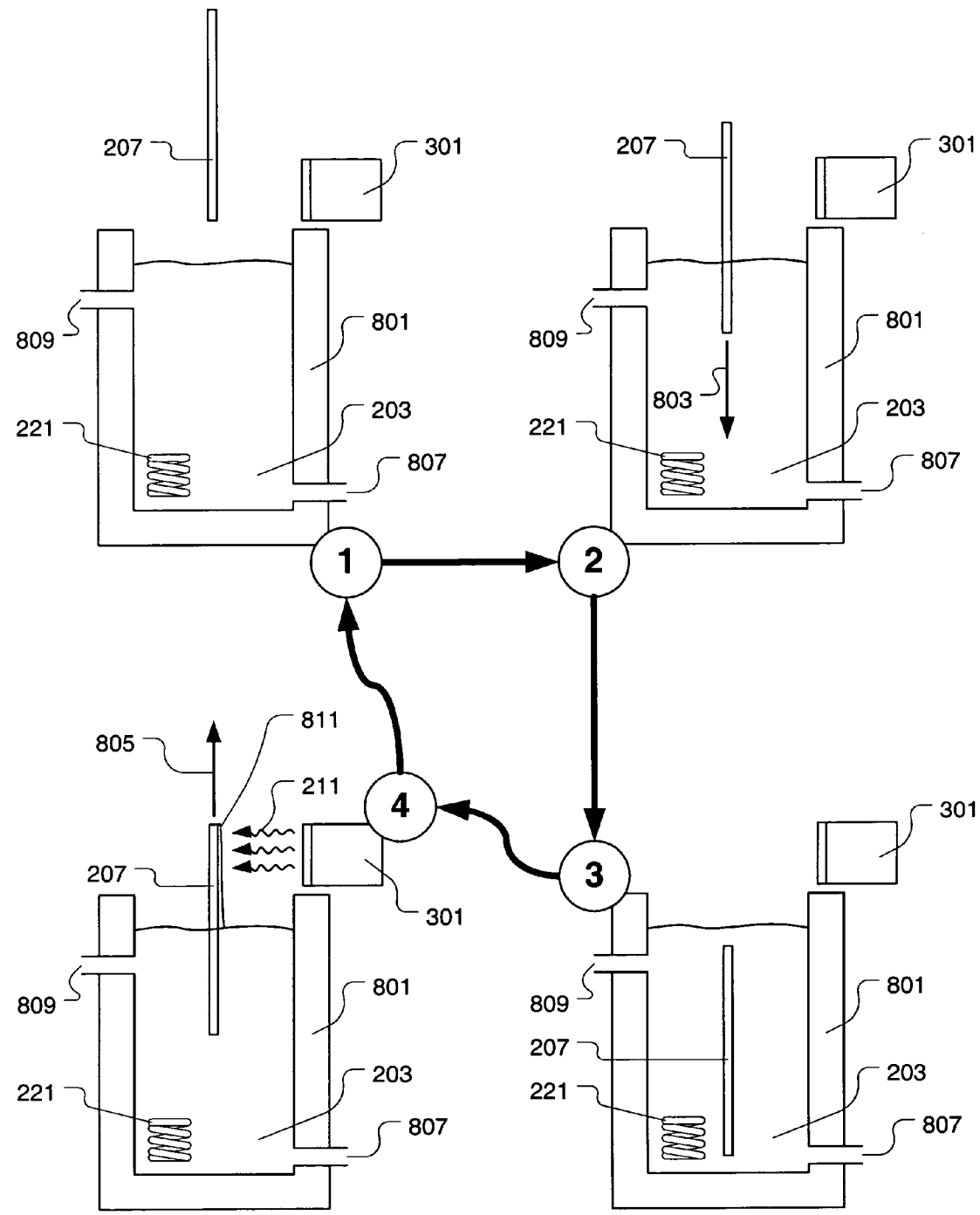
FIG. 8 is an illustration showing an apparatus for depositing material on the surface of the wafer, in accordance with one embodiment of the present invention.

FIG. 8 is an illustration showing an apparatus for depositing material on the surface of the wafer 207, in accordance with one embodiment of the present invention. The apparatus includes a tank 801 defined by an enclosing wall and a bottom. The tank 801 is configured to contain the electroless plating solution 203. In one embodiment, the tank 801 is configured to have an inlet 807 and an outlet 809 for supplying and removing, respectively, the electroless plating solution 203. Thus, similar to the inlet 213 and the outlet 215 of FIG. 2A, the inlet 807 and the outlet 809 of FIG. 8 can be used to control a flow of the electroless plating solution 203 through the tank 801. Also, analogous to FIG. 2A, the heat exchanger 221 can be implemented within the tank 801 to maintain a temperature of the electroless plating solution 203 within the tank 801. Alternatively, the heat exchanger 221 can be implemented outside of the tank 801 to maintain the temperature of the electroless plating solution 203 entering the tank 801.

The apparatus of FIG. 8 also includes a wafer holder (not shown) configured to dip the wafer 207 into the electroless plating solution 203 contained within the tank 801. The wafer holder is also configured to remove the wafer 207 from the electroless plating solution 203. The wafer holder is suitably configured to engage and securely hold the wafer 207 as the wafer 207 is dipped into and removed from the electroless plating solution 203 within the tank 801. Also, the wafer holder is capable of moving the wafer at a controlled rate within a substantially constant plane of orientation.

The apparatus of FIG. 8 further includes the collimated radiant energy source 301 disposed above the electroless plating solution 203. The collimated radiant energy source 301 is oriented to direct the radiant energy 211 toward the wafer 207 upon removal of the wafer 207 from the electroless plating solution 203. The radiant energy 211 is equivalent to that previously discussed with respect to FIG. 2A. Thus, the radiant energy 211 has a wavelength range that is capable of selectively heating a particular material present at a surface of the wafer 207 upon which the radiant energy 211 is incident. As the wafer 207 is removed from the electroless plating solution 203 within the tank 801, a meniscus of electroless plating solution 811 adheres to the surface of the wafer 207. Thus, the selective heating of the particular material by the radiant energy 211 causes electroless plating reactions to occur at the interface between the particular material and the meniscus of electroless plating solution 811.

In one embodiment, the collimated radiant energy source 301 is configured to collimate the radiant energy 211 within a limited solid angle. In this embodiment, the collimated radiant energy source 301 is oriented such that the limited solid angle of radiant energy 211 is directed to be substantially perpendicular to the plane of orientation within which the wafer 207 moves. The collimated radiant energy source 301 is also configured to be scanned over the surface of the wafer 207. It should be appreciated that in this embodiment, the collimated radiant energy source 301 can be configured to scan in any direction over the surface of the wafer 207.

Also, in this embodiment, the collimated radiant energy source 301 can be configured to rotate in a conical manner about an axis that extends from a point of rotation perpendicularly through the plane of orientation within which the wafer 207 moves. However, regardless of the specific scanning or rotational motion utilized, the collimated radiant energy source 301 of this embodiment is configured to apply a substantially uniform amount of radiant energy 211 to the surface of the wafer 207 as the wafer 207 is removed from the electroless plating solution 203. In another embodiment, the collimated radiant energy source 301 is configured to emit the radiant energy within a narrow solid angle that subtends a diameter of the wafer. In this embodiment, the collimated radiant energy source 301 can be maintained in a stationary position with respect to the tank 801 while applying a substantially uniform amount of radiant energy 211 to the surface of the wafer 207 as the wafer 207 is removed from the electroless plating solution 203. In yet another embodiment, an array of collimated radiant energy sources 301 can be positioned to apply radiant energy 211 to the surface of the wafer 207 in a substantially uniform manner as the wafer 207 is removed from the electroless plating solution 203.

FIG. 8 also illustrates a sequence of operational states of the apparatus. In a state 1, the wafer 207 is positioned above the electroless plating solution 203 contained within the tank 801. In the state 1, the collimated radiant energy source 301 is inactive. In a state 2, the wafer 207 is dipped into the electroless plating solution 203 contained within the tank 801 as indicated by an arrow 803. In the state 2, the collimated radiant energy source 301 is inactive. In a state 3, the wafer 207 is fully submerged within the electroless plating solution 203 contained within the tank 801. In the state 3, the collimated radiant energy source 301 is inactive. In a state 4, the collimated radiant energy source is activated, and the wafer 207 is removed from the electroless plating solution 203 contained within the tank 801 as indicated by an arrow 805. As the wafer 207 is removed from the electroless plating solution 203, the meniscus of electroless plating solution 811 adheres to the surface of the wafer 207. The radiant energy 211 incident upon the wafer 207 surface causes a particular material present on the wafer 207 surface to be heated. Heating of the particular material present on the wafer 207 surface causes an electroless plating reaction to occur at an interface between the particular material and the meniscus of electroless plating solution 811. As the wafer 207 is completely removed from the electroless plating solution 203 contained within the tank 801, the entire wafer surface is uniformly exposed to the radiant energy 211. Thus, material is uniformly deposited over the wafer 207 surface through uniformly distributed electroless plating reactions. It should be appreciated that during operation of the apparatus of FIG. 8, the flow and temperature of the electroless plating solution 203 within the tank 801 can be controlled as previously described with respect to FIG. 2A.

Figure 9:
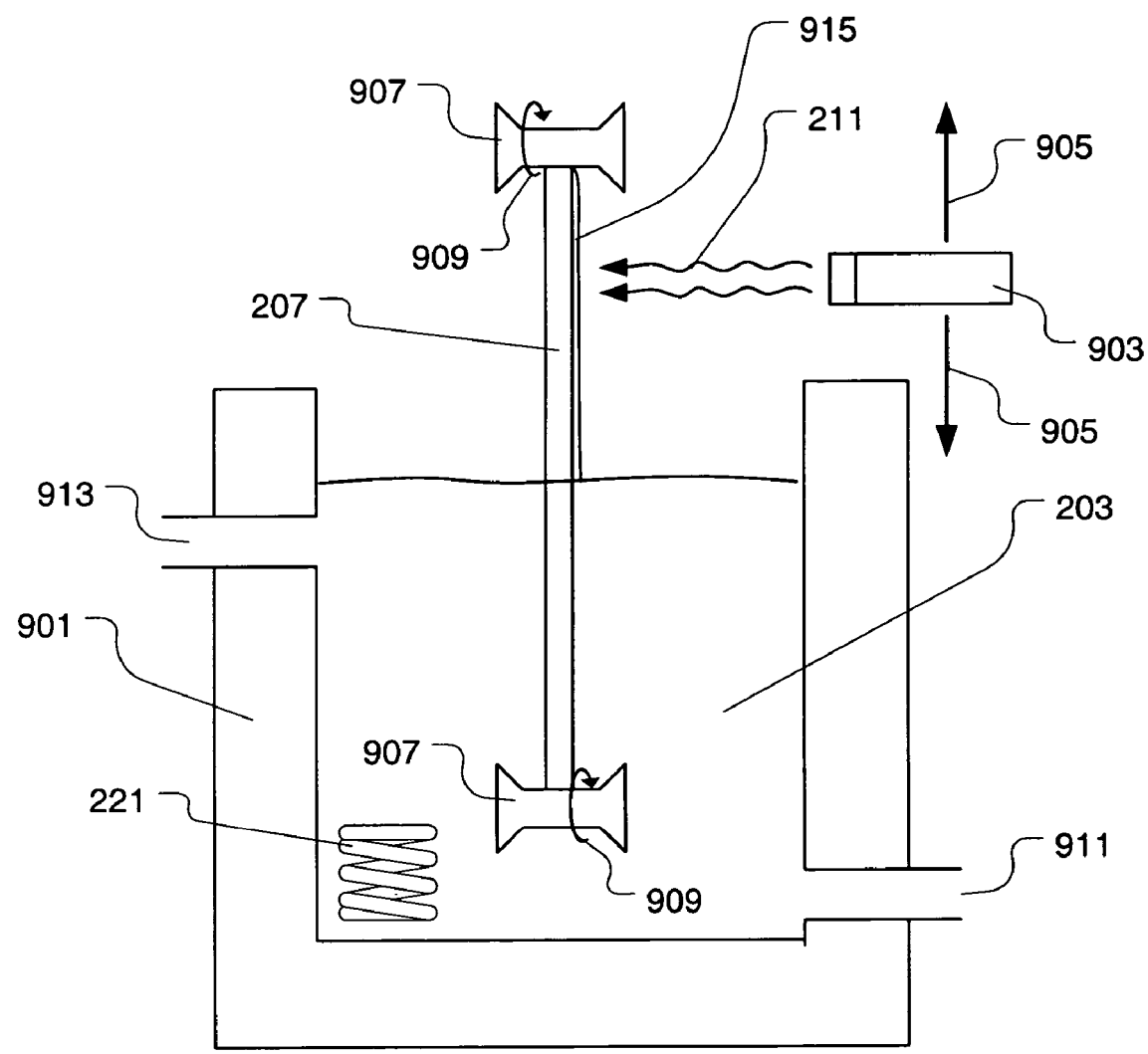
FIG. 9 is an illustration showing an apparatus for depositing material on the surface of the wafer, in accordance with one embodiment of the present invention.

FIG. 9 is an illustration showing an apparatus for depositing material on the surface of the wafer 207, in accordance with one embodiment of the present invention. The apparatus includes a tank 901 defined by an enclosing wall and a bottom. The tank 901 is configured to contain the electroless plating solution 203. In one embodiment, the tank 901 is configured to have an inlet 911 and an outlet 913 for supplying and removing, respectively, the electroless plating solution 203. Thus, similar to the inlet 213 and the outlet 215 of FIG. 2A, the inlet 911 and the outlet 913 of FIG. 9 can be used to control a flow of the electroless plating solution 203 through the tank 901. Also, analogous to FIG. 2A, the heat exchanger 221 can be implemented within the tank 901 to maintain a temperature of the electroless plating solution 203 within the tank 901. Alternatively, the heat exchanger 221 can be implemented outside of the tank 901 to maintain the temperature of the electroless plating solution 203 entering the tank 901.

The apparatus of FIG. 9 also includes a wafer support and rotation mechanism 907. The wafer support and rotation mechanism 907 is configured to support the wafer 207 at a position in which a lower portion of the wafer is submerged within the electroless plating solution 203. In one embodiment, the wafer support and rotation mechanism 907 includes a number of rollers disposed about a periphery of the wafer 207. Each of the number of rollers are defined to support and rotate the wafer in a controlled manner within a substantially constant plane of orientation, as indicated by arrows 909. In one embodiment, the wafer holder 907 is also configured to lower the wafer 207 about halfway into the electroless plating solution 203 and remove the wafer 207 from the electroless plating solution 203 upon completion of the material deposition process.

The apparatus of FIG. 9 further includes a collimated radiant energy source 903 disposed above the electroless plating solution 203. The collimated radiant energy source 903 is oriented to direct the radiant energy 211 toward the wafer 207 upon rotation of the wafer 207 out of the electroless plating solution 203. The radiant energy 211 is equivalent to that previously discussed with respect to FIG. 2A. Thus, the radiant energy 211 has a wavelength range that is capable of selectively heating a particular material present at a surface of the wafer 207 upon which the radiant energy 211 is incident. As the wafer 207 is rotated out of the electroless plating solution 203 within the tank 901, a meniscus of electroless plating solution 915 adheres to the surface of the wafer 207. Thus, the selective heating of the particular material by the radiant energy 211 causes electroless plating reactions to occur at the interface between the particular material and the meniscus of electroless plating solution 915. Additionally, the collimated radiant energy source 903 is further configured to scan across the wafer 207 surface, as indicated by arrows 905. Scanning of the collimated radiant energy source 903 is controlled to ensure that a substantially uniform amount of the radiant energy 211 is applied over the surface of the wafer 207 as the wafer 207 is rotated out of the electroless plating solution 203. Thus, upon completion of each revolution of the wafer 207 out of the electroless plating solution 203, the entire wafer 207 surface is uniformly exposed to the radiant energy 211. In following, material is uniformly deposited over the wafer 207 surface through uniformly distributed electroless plating reactions.

In one embodiment, the collimated radiant energy source 903 is configured to collimate the radiant energy 211 within a limited solid angle. In this embodiment, the collimated radiant energy source 903 is oriented such that the limited solid angle of radiant energy 211 is directed to be substantially perpendicular to the plane of orientation within which the wafer 207 rotates. The collimated radiant energy source 903 can be further configured to rotate in a conical manner about an axis that extends from a reference point attached to the collimated radiant energy source 903 perpendicularly through the plane of orientation within which the wafer 207 rotates. In another embodiment, an array of collimated radiant energy sources 903 can be positioned to apply radiant energy 211 to the surface of the wafer 207 in a substantially uniform manner as the wafer 207 is rotated out of the electroless plating solution 203.

Figure 10A:
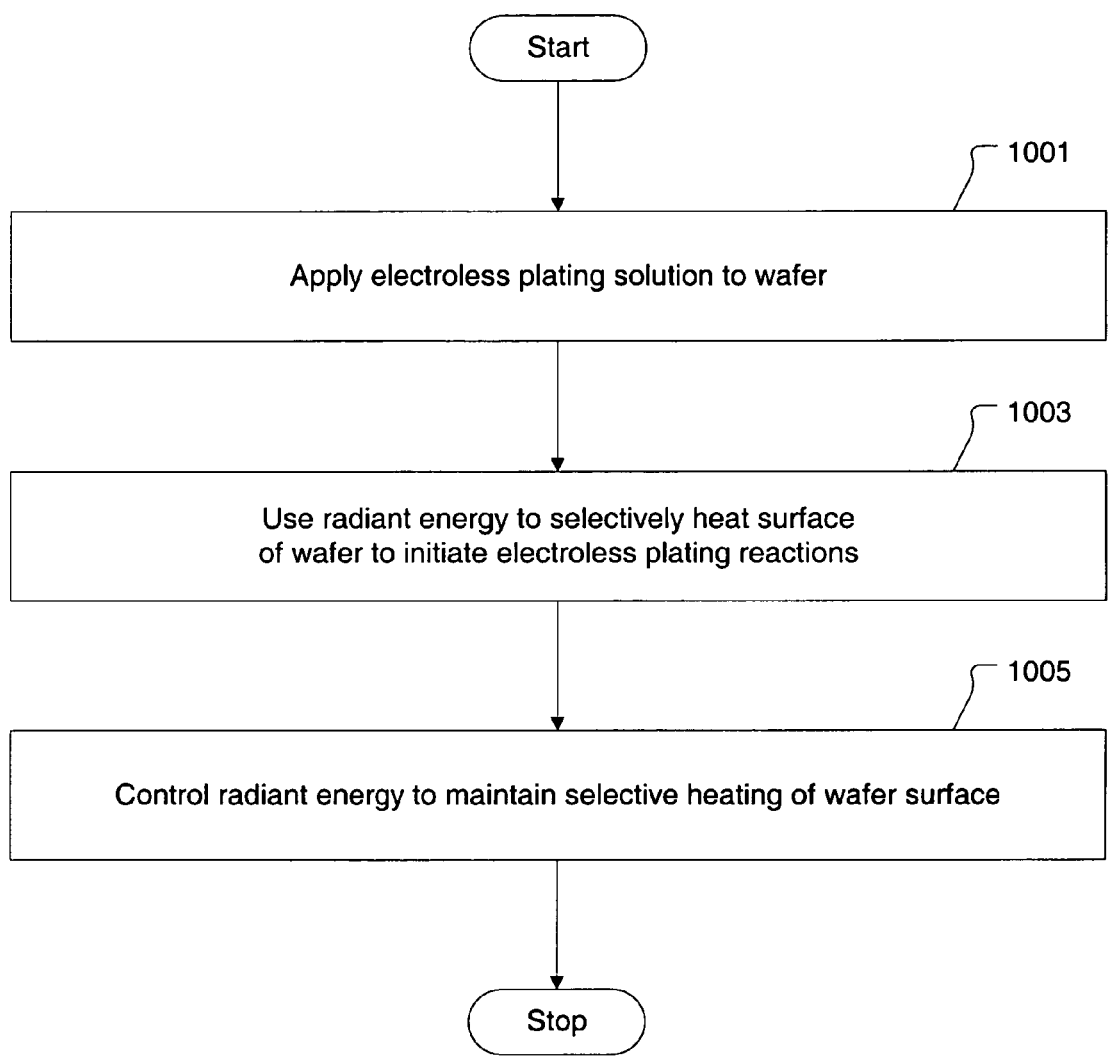
FIG. 10A is an illustration showing a flowchart of a method for depositing a material on a surface of a wafer, in accordance with one embodiment of the present invention.

FIG. 10A is an illustration showing a flowchart of a method for depositing a material on a surface of a wafer, in accordance with one embodiment of the present invention. The method includes an operation 1001 in which electroless plating solution is applied to a surface of a wafer. A temperature of the electroless plating solution applied to the wafer surface is maintained below a temperature at which an electroless plating reaction will occur. In one embodiment, the temperature of the electroless plating solution is maintained substantially below the temperature at which the electroless plating reaction will occur. The method also includes an operation 1003 in which the wafer surface is exposed to radiant energy. The radiant energy is used to selectively heat a particular material present on the wafer surface to a state at which electroless plating reactions will occur at an interface between the particular material on the wafer surface and the electroless plating solution. In one embodiment, the wafer surface is exposed to the radiant energy in a substantially uniform manner to cause the electroless plating reactions to occur in a substantially uniform amount over the wafer surface. Consequently, uniformity in electroless plating reactions over the wafer surface will result in material deposition uniformity over the wafer surface. The method further includes an operation 1005 in which the radiant energy is controlled to maintain selective heating of the particular material present on the wafer surface. In one embodiment, the wavelength range of the radiant energy is controlled to cause preferential excitation of the atoms/molecules of the particular material without exciting the atoms/molecules of different surrounding materials. It should be understood that controlling a frequency of the radiant energy is equivalent to controlling the wavelength range of the radiant energy. Preferential excitation of the atoms/molecules of the particular material will cause the particular material to increase in temperature. In various exemplary embodiments, the particular material can be defined as either a barrier layer or a seed layer. It should be appreciated, however, that the radiant energy can be configured to allow the method of the present invention to be applied to essentially any material present on the wafer surface.

Figure 10B:
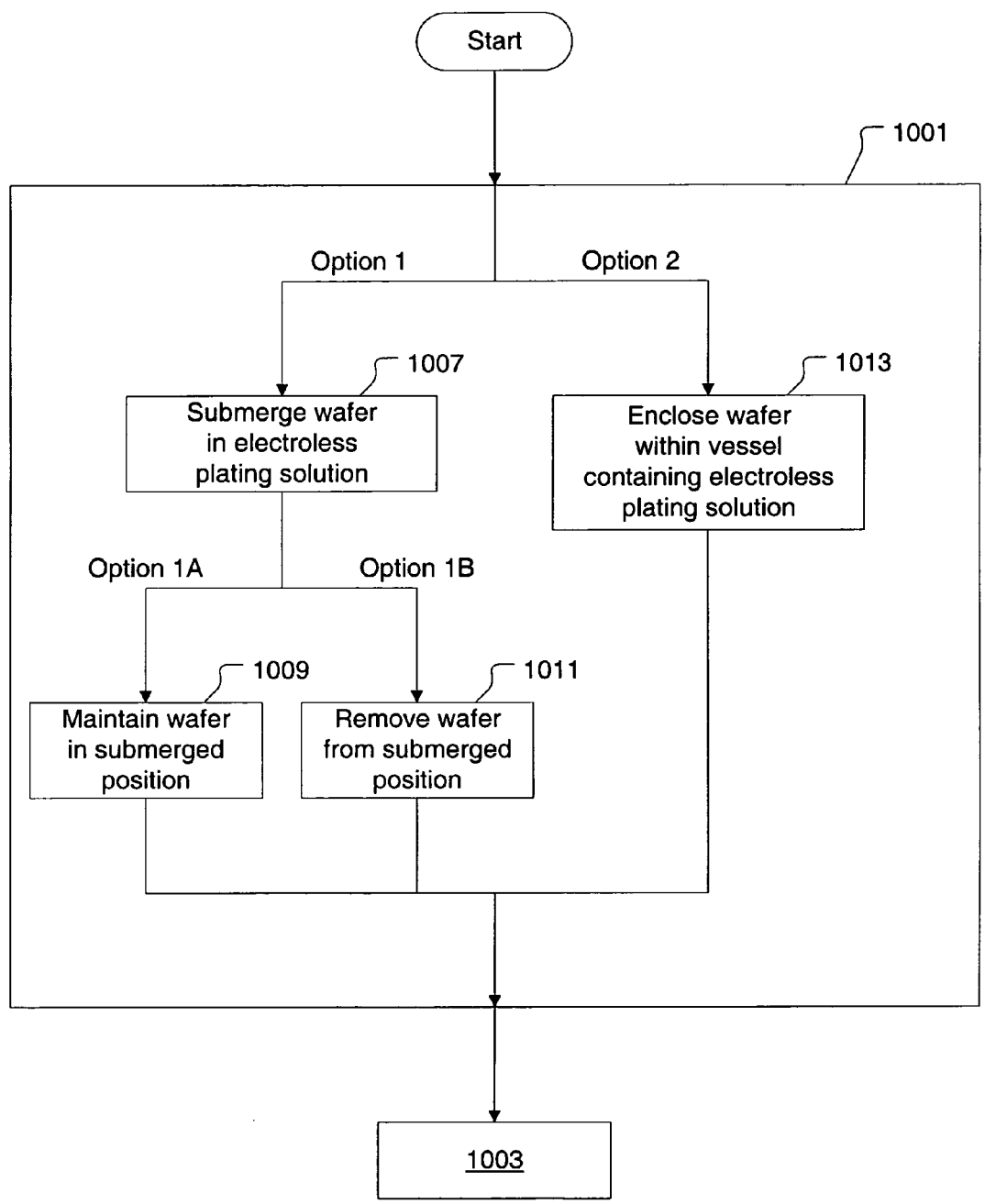
FIG. 10B is an illustration showing an expansion of the operation 1001 of FIG. 10A, in accordance with one embodiment of the present invention.

FIG. 10B is an illustration showing an expansion of the operation 1001 of FIG. 10A, in accordance with one embodiment of the present invention. In one embodiment, the operation 1001 includes two options ("Option 1" and "Option 2") for applying the electroless plating solution to the wafer surface. Option 1 includes an operation 1007 in which the wafer is submerged in a bath of electroless plating solution. Once the wafer is submerged in the bath of electroless plating solution, Option 1 branches into two sub-options ("Option 1A" and "Option 1B"). Option 1A includes an operation 1009 in which the wafer is maintained in a submerged position within the bath of electroless plating solution. In one embodiment, the electroless plating solution is caused to flow over the wafer surface while submerged. In another embodiment, the wafer is caused to oscillate while submerged. Option 1B includes an operation 1011 in which the wafer is removed from the submerged position within the electroless plating solution. When removed from the submerged position in the operation 1011, a meniscus of the electroless plating solution adheres to the wafer surface. Thus, the electroless plating solution remains applied to the wafer surface even though the wafer is removed from the submerged position. In one embodiment, a sequence of submerging and removing the wafer from the bath of the electroless plating solution is performed repeatedly as the wafer surface being removed from the bath is exposed to the radiant energy according to the operation 1003. In this embodiment, the sequence of submerging and removing continues until a desired amount of material is deposited on the surface of the wafer through electroless plating reactions. In one embodiment, the sequence of submerging and removing the wafer from the bath of electroless plating solution is performed by dipping the wafer into the bath of electroless plating solution. In an alternative embodiment, the sequence of submerging and removing the wafer from the bath of electroless plating solution is performed by rotating a portion of the wafer through the bath of electroless plating solution.

Option 2 is provided as an alternative to Option 1 for applying the electroless plating solution to the wafer surface. Option 3 includes an operation 1013 in which the wafer is enclosed within a vessel containing the electroless plating solution. In one embodiment, the vessel is completely filled with the electroless plating solution. In another embodiment, the vessel is partially filled with the electroless plating solution, wherein the wafer is submerged within the electroless plating solution. Enclosure of the wafer within the vessel allows for an increase in the pressure of the electroless plating solution applied to the wafer. Increasing the pressure of the electroless plating solution results in an increased density of nucleation sites at which electroless plating reactions will occur on the wafer surface. Additionally, increasing the pressure of the electroless plating solution can be used to suppress formation of bubbles that evolve from electroless plating reactions.

Figure 10C:
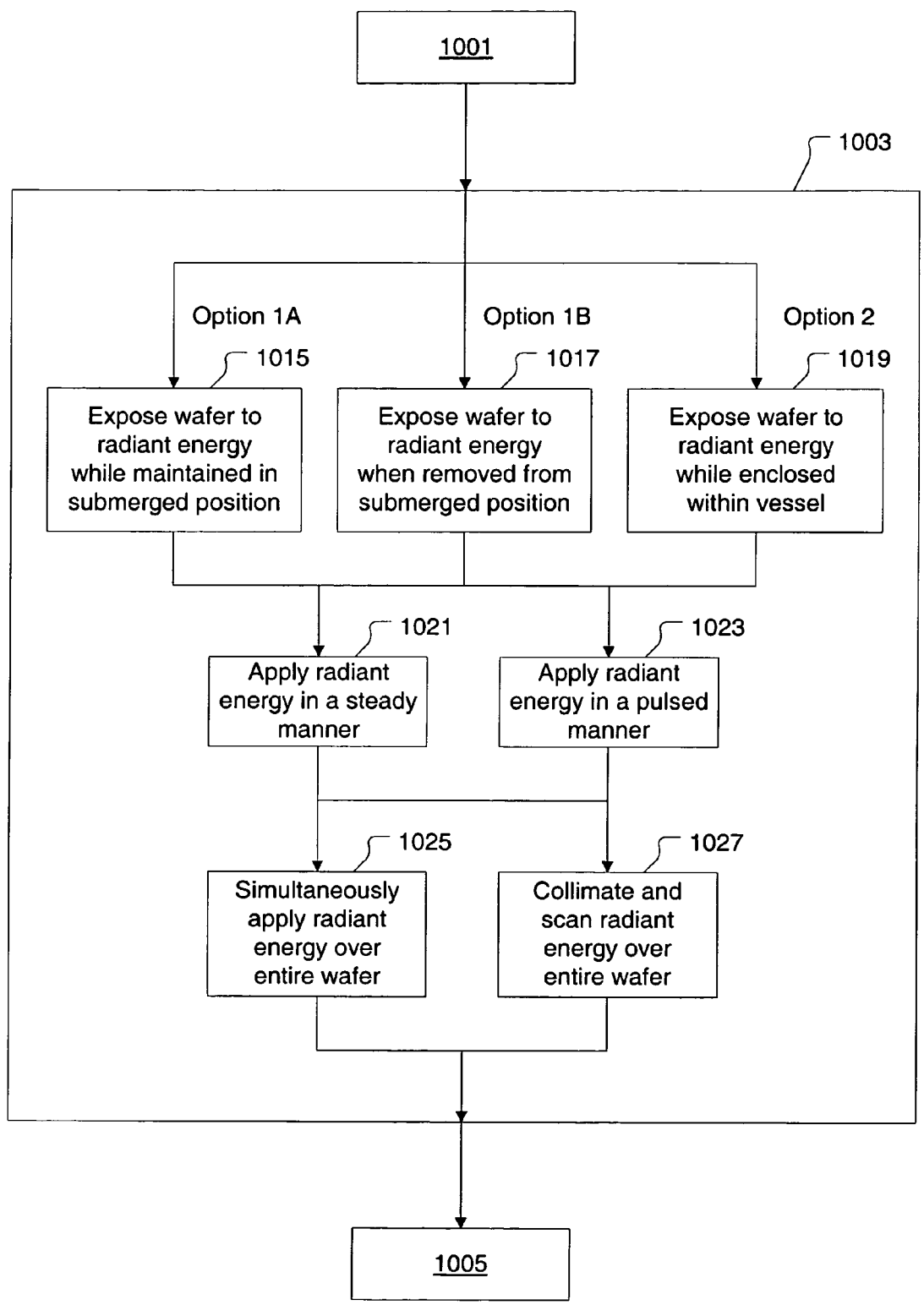
FIG. 10C is an illustration showing an expansion of the operation 1003 of FIG. 10A, in accordance with one embodiment of the present invention.

FIG. 10C is an illustration showing an expansion of the operation 1003 of FIG. 10A, in accordance with one embodiment of the present invention. The operation 1003 for using the radiant energy to selectively heat a particular material present on the wafer surface to initiate electroless plating reactions is described in a context of the options for applying the electroless plating solution to the wafer surface (i.e., Option 1A, Option 1B, and Option 2). In accordance with Option 1A, as previously discussed with respect to FIG. 10B, an operation 1015 is performed in which the wafer is exposed to the radiant energy while being maintained in the submerged position within the bath of electroless plating solution. In accordance with Option 1B, as previously discussed with respect to FIG. 10B, an operation 1017 is performed in which the wafer is exposed to the radiant energy when removed from the submerged position within the bath of electroless plating solution. In one embodiment of operation 1017, the wafer surface is exposed to the radiant energy immediately upon removal from the bath of electroless plating solution. In accordance with Option 2, as previously discussed with respect to FIG. 10B, an operation 1019 is performed in which the wafer is exposed to the radiant energy while enclosed within the vessel containing the electroless plating solution. In one embodiment, a source of the radiant energy is disposed within the vessel. In another embodiment, the radiant energy is transmitted through a wall of the vessel to reach the wafer surface.

In addition to the options for applying the electroless plating solution to the wafer and exposing the wafer to the radiant energy (i.e., Option 1A, Option 1B, and Option 2), there are also options for how the radiant energy is applied to the wafer surface. In an operation 1021, the radiant energy is applied the wafer surface in steady manner. In other words, the radiant energy is constantly applied to the wafer surface for the duration of the material deposition process. Alternatively, in an operation 1023, the radiant energy is applied to the wafer surface in a pulsed manner during the material deposition process. In one embodiment, a pulse of the radiant energy is defined to have a duration within a range extending from about 1 millisecond to about 500 milliseconds. Also, in one embodiment, a sufficient amount of time is provided between pulses of the radiant energy to allow the electroless plating solution to quench the wafer surface. It should be appreciated that both the constant and the pulsed radiant energy applications can be used with any of Options 1A, 1B, and 2.

Options also exist for achieving uniform application of the radiant energy over the wafer surface. In an operation 1025, the radiant energy is simultaneously applied over the entire wafer surface. In an operation 1027, the radiant energy is collimated and scanned over the entire wafer surface. It should be appreciated that either option of operations 1025 and 1027 can be used with both the constant and the pulsed radiant energy applications of operations 1021 and 1023. However, regardless of the specific method by which the radiant energy is applied to the wafer surface, the radiant energy is applied in a substantially uniform manner over the entire wafer surface.

Figure 10D:
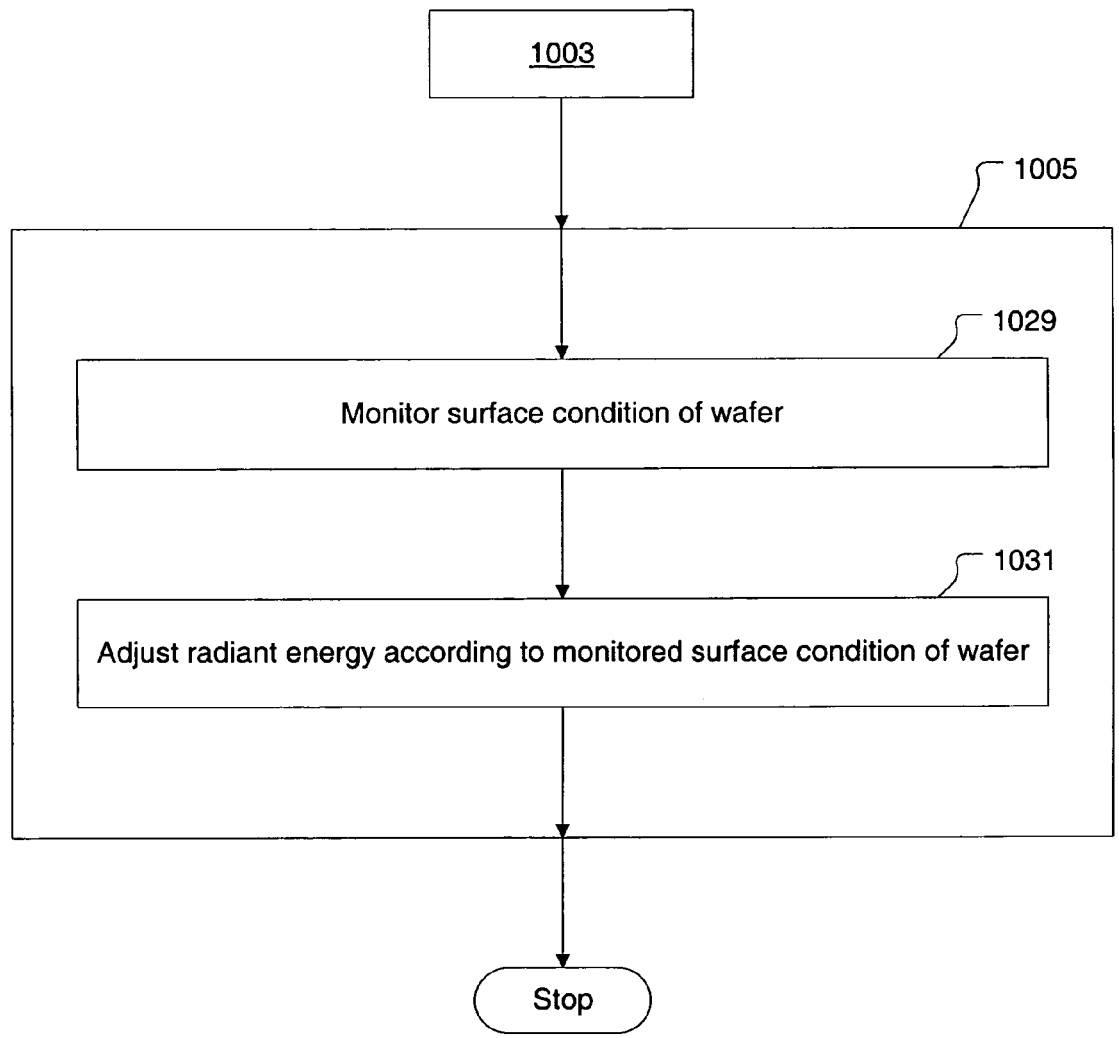
FIG. 10D is an illustration showing an expansion of the operation 1005 of FIG. 10A, in accordance with one embodiment of the present invention.

FIG. 10D is an illustration showing an expansion of the operation 1005 of FIG. 10A, in accordance with one embodiment of the present invention. In one embodiment, the operation 1005 for controlling the radiant energy to maintain selective heating of the particular material present on the wafer surface includes an operation 1029 for monitoring a surface condition of the wafer. The monitoring of operation 1029 provides feedback to ensure that the wavelength range of the radiant energy is established to selectively heat the desired material present at the surface of the wafer. Surface condition parameters monitored in the operation 1029 can include a surface material type, a surface material thickness, and a surface material temperature. It should be appreciated, however, that any other surface condition parameter commonly monitored during wafer fabrication processes can also be monitored during the operation 1029. In one embodiment, the operation 1005 can also include an operation 1031 in which the radiant energy is adjusted according to the monitored surface conditions obtained in the operation 1029.

As described above, the present invention provides a method and apparatus for selectively heating a surface of the wafer exposed to an electroless plating solution. The selective heating is provided by applying radiant energy to the wafer surface. The radiant energy is defined to have a wavelength range that will preferentially heat a material present on the wafer surface relative to other surrounding materials. The radiant energy can be adjusted during the plating process to optimally follow changing conditions of the material present on the wafer surface. The selective heating of the wafer surface causes a temperature increase at an interface between the wafer surface and the electroless plating solution. The temperature increase at the interface in turn causes a plating reaction to occur at the wafer surface. Thus, material is deposited on the wafer surface through an electroless plating reaction that is initiated and controlled by varying the temperature of the wafer surface using an appropriately defined radiant energy source.

The advantages provided by the present invention are numerous. For example, with the present invention, materials can be deposited on the wafer surface to conform to a topography of the wafer surface. Also, the present invention allows for denser material deposition, smaller grain sizes, and improved adhesion of deposited materials. Furthermore, the present invention provides for improved material deposition on wafer surfaces having smaller minimum geometries. For example, the present invention can be used to uniformly fill narrow gaps between high aspect ratio features on the wafer surface.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for depositing a material on a surface of a wafer, comprising:
    a tank defined by an enclosing wall and a bottom, the tank being configured to contain an electroless plating solution;
    a wafer support structure disposed within the tank, the wafer support structure being configured to support a wafer at a submerged position within the electroless plating solution to be contained within the tank; and
    a radiant energy source disposed above the wafer support structure, the radiant energy source oriented to direct radiant energy toward the wafer to be supported at the submerged position within the electroless plating solution, wherein the radiant energy source is designed to generate radiant energy having a wavelength range that will be selectively absorbed by atoms, molecules, or both atoms and molecules of a first material present at a surface of the wafer upon which the radiant energy is incident without being substantially absorbed by a second material present at the surface of the wafer near the first material, wherein the selective absorption of the radiant energy by the first material will cause a selective heating and increased temperature of the first material, and wherein the lack of substantial absorption of the radiant energy by the second material will avoid a substantial heating and increased temperature of the second material, wherein the radiant energy source is defined to sufficiently heat the first material in exposure to the electroless plating solution so as to cause an electroless plating reaction to selectively occur on the first material without occurring on the second material.

2. An apparatus for depositing a material on a surface of a wafer as recited in claim 1, wherein the radiant energy source is configured to apply a substantially uniform amount of the radiant energy over the surface of the wafer.

3. An apparatus for depositing a material on a surface of a wafer as recited in claim 2, wherein the radiant energy source is stationary.

4. An apparatus for depositing a material on a surface of a wafer as recited in claim 2, wherein the radiant energy source is configured to collimate the radiant energy, the radiant energy source being further configured to be scanned over the surface of the wafer.

5. An apparatus for depositing a material on a surface of a wafer as recited in claim 1, wherein the wafer support structure is configured to oscillate the wafer.

6. An apparatus for depositing a material on a surface of a wafer as recited in claim 1, further comprising:
    an inlet for supplying the electroless plating solution to the tank; and
    an outlet for removing the electroless plating solution from the tank.

7. An apparatus for depositing a material on a surface of a wafer as recited in claim 1, further comprising:
    a heat exchanger capable of maintaining a temperature of the electroless plating solution to be contained within the tank.

8. An apparatus for depositing a material on a surface of a wafer as recited in claim 1, wherein the radiant energy source is defined to operate in a pulsed manner so at to enable successive heating and quenching of the first material in a cyclic manner.

9. An apparatus for depositing a material on a surface of a wafer, comprising:
    a vessel defined by a top, a bottom, and an enclosing wall, the vessel being configured to contain an electroless plating solution;
    a wafer support structure disposed within the vessel, the wafer support structure being configured to support a wafer at a position within the vessel; and
    a radiant energy source disposed above the wafer support structure, the radiant energy source oriented to direct radiant energy toward the wafer to be supported within the vessel, wherein the radiant energy source is designed to generate radiant energy having a wavelength range that will be selectively absorbed by atoms, molecules, or both atoms and molecules of a first material present at a surface of the wafer upon which the radiant energy is incident without being substantially absorbed by a second material present at the surface of the wafer near the first material, wherein the selective absorption of the radiant energy by the first material will cause a selective heating and increased temperature of the first material, and wherein the lack of substantial absorption of the radiant energy by the second material will avoid a substantial heating and increased temperature of the second material, wherein the radiant energy source is defined to sufficiently heat the first material in exposure to the electroless plating solution so as to cause an electroless plating reaction to selectively occur on the first material without occurring on the second material.

10. An apparatus for depositing a material on a surface of a wafer as recited in claim 9, wherein the radiant energy source is disposed outside the vessel, the vessel being composed of a material capable of transmitting radiant energy emitted from the radiant energy source to an interior of the vessel.

11. An apparatus for depositing a material on a surface of a wafer as recited in claim 9, wherein the radiant energy source is disposed within the vessel.

12. An apparatus for depositing a material on a surface of a wafer as recited in claim 9, wherein the radiant energy source is configured to apply a substantially uniform amount of the radiant energy over the surface of the wafer.

13. An apparatus for depositing a material on a surface of a wafer as recited in claim 9, wherein the radiant energy source is stationary.

14. An apparatus for depositing a material on a surface of a wafer as recited in claim 9, wherein the radiant energy source is configured to collimate the radiant energy, the radiant energy source being further configured to be scanned over the surface of the wafer.

15. An apparatus for depositing a material on a surface of a wafer as recited in claim 9, wherein the wafer support structure is configured to oscillate the wafer.

16. An apparatus for depositing a material on a surface of a wafer as recited in claim 9, further comprising:
   a pressure control capable of controlling a pressure of the electroless plating solution to be contained within the vessel.

17. An apparatus for depositing a material on a surface of a wafer as recited in claim 9, further comprising:
   an inlet for supplying the electroless plating solution to the vessel; and
   an outlet for removing the electroless plating solution from the vessel.

18. An apparatus for depositing a material on a surface of a wafer as recited in claim 9, further comprising:
   a heat exchanger capable of maintaining a temperature of the electroless plating solution to be contained within the vessel.

19. An apparatus for depositing a material on a surface of a wafer as recited in claim 9, wherein the radiant energy source is defined to operate in a pulsed manner so at to enable successive heating and quenching of the first material in a cyclic manner.

* * * * *